United States Patent

Ishinaga et al.

[11] Patent Number: 6,093,940
[45] Date of Patent: Jul. 25, 2000

[54] LIGHT-EMITTING DIODE CHIP COMPONENT AND A LIGHT-EMITTING DEVICE

[75] Inventors: Hiroki Ishinaga; Takehiro Fujii, both of Kyoto, Japan

[73] Assignee: Rohm Co., Ltd., Kyoto, Japan

[21] Appl. No.: 09/275,944

[22] Filed: Mar. 25, 1999

Related U.S. Application Data

[63] Continuation-in-part of application No. 09/058,889, Apr. 13, 1998, Pat. No. 5,942,770.

[30] Foreign Application Priority Data

Apr. 14, 1997 [JP] Japan ................................ H9-095430

[51] Int. Cl.[7] ..................................................... H01L 33/00
[52] U.S. Cl. ................................. 257/99; 257/100; 257/88
[58] Field of Search ............................... 257/99, 100, 79, 257/88, 89, 91; 362/800

[56] References Cited

U.S. PATENT DOCUMENTS

| | | | |
|---|---|---|---|
| 5,298,768 | 3/1994 | Okazaki et al. ........................... | 257/99 |
| 5,475,241 | 12/1995 | Harrah et al. ............................. | 257/99 |
| 5,814,837 | 9/1998 | Okazaki .................................... | 257/100 |
| 5,841,177 | 11/1998 | Komoto et al. ........................... | 257/431 |

*Primary Examiner*—Minh Loan Tran
*Attorney, Agent, or Firm*—Arent Fox Kintner Plotkin & Kahn, PLLC

[57] ABSTRACT

An LED chip component has a resin molding which can be firmly fixed to an insulating substrate even in a case where the exposed area of the insulating substrate cannot be increased any further. To achieve this object, according to a first embodiment, a resin molding is so formed as to flow into (i.e., reach the inside of) a through hole formed in an insulating substrate, and according to a second embodiment, a resin molding is so formed as to flow into two cuts formed respectively at two opposing side edges of an insulating substrate so that the resin molding holds the insulating substrate at two opposing side edges.

1 Claim, 6 Drawing Sheets

LIGHT-EMITTING DIODE CHIP COMPONENT AND A LIGHT-EMITTING DEVICE

This is a Continuation-in-Part Application of application Ser. No. 09/058,889 filed Apr. 13, 1998, now U.S. Pat. No. 5,942,770.

BACKGROUND OF THE INVENTION

1. Field of the Invention

The present invention relates to a light-emitting diode chip component and to a light-emitting device fitted with such a light-emitting diode chip component.

2. Description of the Prior Art

Conventionally, two-color LED (light-emitting diode) chip components are widely used that are formed by placing two LED elements on a substrate so that it can emit light in two colors. FIG. 10A shows an example of such a two-color LED chip component. FIG. 10A is a perspective view of a small-sized LED chip component 109 for surface-mounting as seen obliquely from above. In FIG. 10A, numeral 1 represents an insulating substrate made of a heat-resistant material; numerals 2a and 2b represent LED elements; numeral 3 represents wires made of metal such as gold or aluminum for wire-bonding; numerals 4a, 4b, 4'a, and 4'b represent patterns of metal formed on the top surface of the insulating substrate 1; numeral 5 represents concave-surfaced cuts formed in four corners of the insulating substrate 1; numeral 6 represents a resin molding, which is indicated by broken lines, for protecting the LED elements 2a and 2b and other elements. The cuts 5 have their surfaces coated with metal extending from the top surface of the insulating substrate 1 to the bottom surface thereof so that they serve as terminals.

As shown in FIG. 10A, the two LED elements 2a and 2b are individually fixed near the center of the top surface of the insulating substrate 1 by die-bonding. The LED elements 2a and 2b have one end connected directly to the land of the patterns 4a and 4b, respectively, with silver paste or the like so as to form electrodes, and have the other end connected through wires 3 to the patterns 4'a and 4'b, respectively, by wire-bonding so as to form electrodes. The patterns 4a, 4b, 4'a, and 4'b each extend toward one of the four corners of the insulating substrate 1 so as to be connected to one of the cuts 5 that serve as terminals. The LED elements 2a and 2b and the wires 3 are sealed in and thereby protected by the resin molding 6.

In the actual manufacturing process, a plurality of units each constructed as shown in FIG. 10A are arranged on a single insulating substrate 1, and thereafter the individual LED chip components 109 are separated from one another by dicing. Meanwhile, the cuts 5 are formed by dividing through holes that have been formed in advance each into four parts. When an LED chip component 109 is mounted on a printed circuit board, it is soldered onto the printed circuit board by reflow soldering, using the cuts 5 as terminals. This requires the LED chip component 109 to be sufficiently heat-resistant, and therefore its insulating substrate 1 is made, for example, of BT (bismaleimide-triazine) resin or a special type of glass-epoxy resin that is highly heat-resistant.

The LED chip component 109 contains a circuit provided with four terminals as shown in FIG. 11. By turning on the LED elements 2a and 2b simultaneously or individually, it is possible to emit light in three colors in total. For example, in a combination where the LEDs 2a and 2b emit red and green light, respectively, they, when turned on simultaneously, provide orange light. The light is emitted principally in a direction normal to the top surface of the insulating substrate 1; that is, in FIG. 10A, the light is emitted upward, achieving so-called top-surface light emission.

In recent years, as portable phones, portable transceivers, and similar appliances become more and more popular, slimness has been eagerly sought in those appliances. As a result, also with LEDs that are widely used for displaying and illumination purposes in such appliances, suitability for use in slim appliances has been eagerly sought. For this reason, to minimize the effect of the size of LEDs on the thickness of appliances, such LEDs have been developed as achieve so-called side-surface light emission and can therefore be used to illuminate a display or the like from its sides. Thus, also in two-color LED chip components, side-surface light emission is highly desirable.

The easiest and surest way to achieve side-surface light emission is to mount an LED chip component vertically on a printed circuit board, that is, in such a way that a side surface of the insulating substrate on which LED elements are mounted faces the printed circuit board. However, as shown in FIG. 10B, the LED chip component 109 described above is so constructed that, when it is mounted vertically on a printed circuit board 10, whereas the patterns 4a and 4'a for the lower LED element 2a (not shown) can be soldered, the patterns 4b and 4'b for the upper LED element 2b (not shown) are situated away from the printed circuit board and therefore cannot be soldered. Accordingly, it has been customary to adopt this construction only in single-color LED chip components.

In recent years, miniaturization of LED chip components is eagerly sought. Miniaturizing LED chip components inevitable results in reducing the contact surface area between an insulating substrate and a resin molding, which in turn results in weakening the bond strength between them. As a result, the resin molding becomes more prone to come off the insulating substrate when it is subjected to an external mechanical force. In general, a resin molding exhibits a stronger bond strength against metal electrode patterns than against an insulating substrate. Accordingly, it is preferable to minimize the area of electrode patterns and thereby maximize the area in which the insulating substrate is exposed. However, in small LED chip components, it is impossible to reduce the area of electrode patterns beyond a certain limit.

SUMMARY OF THE INVENTION

An object of the present invention is to provide a two-color LED chip component whose terminals are so arranged that side-surface light emission can be achieved simply by vertical mounting of the LED chip component.

To achieve the above object, according to the present invention, in an LED chip component comprising an insulating substrate, two LED elements that are mounted on one surface of the insulating substrate and that each have a first electrode and a second electrode, and a plurality of patterns that are formed on that one surface of the insulating substrate to serve as terminals for connecting the first and second electrodes of each of the two LED elements to outside, two of the patterns that are connected to the first electrode of each of the LED elements extend up to one side edge of the insulating substrate. The patterns for the second electrode of each of the LED elements may be formed as a single common pattern that extends up to that one side edge of the insulating substrate.

Two of the patterns that are connected to the first electrode of each of the LED elements may be so formed as to extend across two opposite side surfaces of the insulating substrate so that they extend from the above-mentioned one surface to the surface of the insulating substrate opposite thereto. The patterns for the second electrode of each of the LED elements may be formed on the surface opposite to the above-mentioned one surface in such as way that they are connected through a through hole to the second electrode of each of the LED elements and are so formed as to extend up to the above-mentioned one side edge. The patterns for the second electrode of each of the LED elements may be so formed that, in the above-mentioned one side edge, they further extend up to a surface of the insulating substrate opposite to the one surface along a cut that is so formed as to extend from said one surface to said opposite surface.

Another object of the present invention is to provide an LED chip component in which a resin molding can be firmly fixed to an insulating substrate even in a case where the exposed area of the insulating substrate cannot be increased any further. To achieve this object, according to a first embodiment, a resin molding is so formed as to flow into (i.e. reach the inside of) a through hole formed in an insulating substrate, and according to a second embodiment, a resin molding is so formed as to flow into two cuts formed respectively at two opposing side edges of an insulating substrate so that the resin molding holds the insulating substrate at two opposing side edges.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
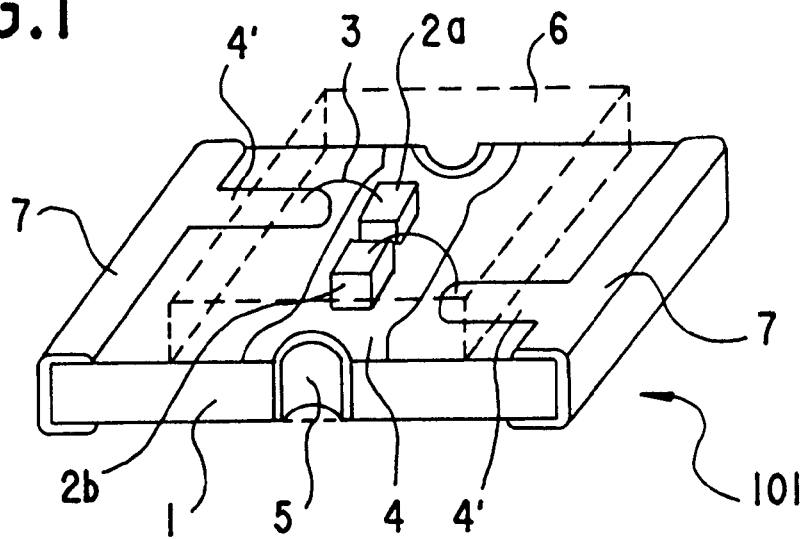
FIG. 1 is a perspective view of the LED chip component of a first embodiment of the invention, as seen obliquely from above.

Hereinafter, embodiments of the present invention will be described with reference to the drawings. FIG. 1 is a perspective view of the LED chip component 101 of a first embodiment of the invention as seen obliquely from above. In FIG. 1, numeral 1 represents an insulating substrate made of a heat-resistant material; numerals 2a and 2b represent LED elements; numeral 3 represents wires made of metal such as gold or aluminum for wire-bonding; numerals 4 and 4' represent patterns of metal formed on the top surface of the insulating substrate 1; numeral 5 represents concave-surfaced cuts formed in side surfaces of the insulating substrate 1; numeral 6 represents a resin molding, which is indicated by broken lines, for protecting the LED elements 2a and 2b and other elements. The cuts 5 have their surfaces coated with metal extending from the top surface of the insulating substrate 1 to the bottom surface thereof so that they serve as terminals. The insulating substrate 1 is, at its right and left ends, fitted with terminal patterns 7 of metal that extend across the right and left side surfaces of the insulating substrate 1 from the top surface to the bottom surface thereof. The resin molding 6 is so formed as to flow into the cuts 5.

As shown in FIG. 1, the two LED elements 2a and 2b are individually fixed near the center of the top surface of the insulating substrate 1 by die-bonding. The LED elements 2a and 2b have one end connected directly to the land of the pattern 4 so as to form a single common electrode, and have the other end connected through wires 3 to the patterns 4' by wire-bonding so as to form two separate electrodes. The pattern 4 extends up to the central portions of the front and rear edges of the insulating substrate 1 and is connected to the cuts 5 so as to form a common terminal. The patterns 4' extend toward the right-hand on left-hand edges, respectively, of the insulating substrate 1 and are connected to the terminal patterns 7. The LED elements 2a and 2b and the wires 3 are sealed in and thereby protected by the resin molding 6.

In the actual manufacturing process, a plurality of units each constructed as shown in FIG. 1 are arranged on a single insulating substrate 1, and thereafter the individual LED chip components 101 are separated from one another by dicing. Meanwhile, the cuts 5 are formed by dividing through holes that have been formed in advance each into two parts. When an LED chip component 101 is mounted on a printed circuit board, it is soldered onto the printed circuit board by reflow soldering, using an area around the cuts 5 and the terminal patterns 7 as terminals. This requires the LED chip component 101 to be sufficiently heat-resistant, and therefore its insulating substrate 1 is made of a material that is highly heat-resistant as in the conventional example described earlier.

Figure 2:
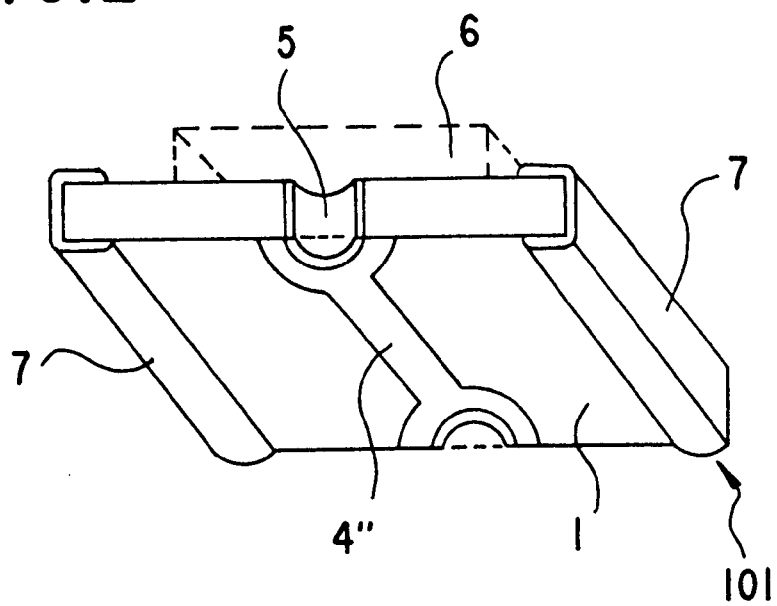
FIG. 2 is a perspective view of the LED chip component of the first embodiment, as seen obliquely from below.

FIG. 2 is a perspective view of the LED chip component 101 as seen obliquely from below. As shown in FIG. 2, on the bottom surface of the insulating substrate 1, a pattern 4" is formed that extends up to the central portions of the front and rear edges of the insulating substrate 1 and is connected to the cuts 5, so that the pattern 4" on the bottom surface and the pattern 4 on the top surface are connected together and thereby form a common terminal as a whole. As described later, this pattern 4" serves also as a land for soldering when the LED chip component 101 is mounted vertically to achieve side-surface light emission.

Figure 3A:
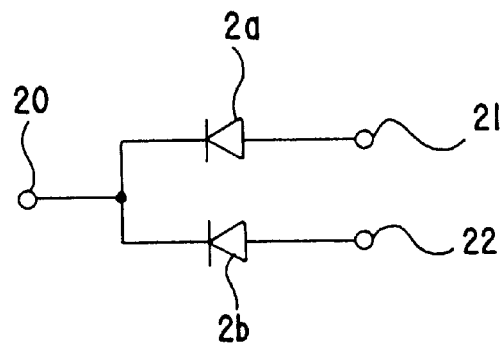
FIG. 3A is a diagram showing an example of the circuit of the LED chip component of the first embodiment.
Figure 3B:
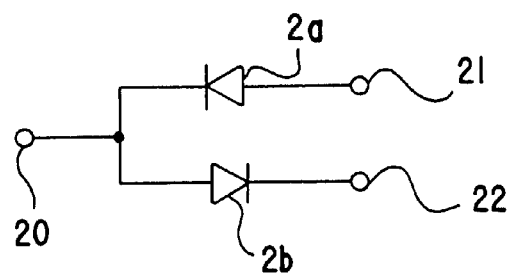
FIG. 3B is a diagram showing another example of the circuit of the LED chip component of the first embodiment.
Figure 3C:
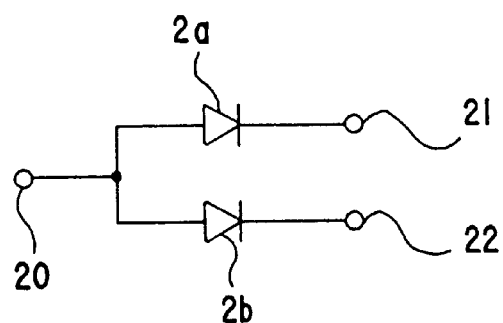
FIG. 3C is a diagram showing still another example of the circuit of the LED chip component of the first embodiment.

The LED chip component 101 contains a circuit provided with three terminals as shown in FIGS. 3A, 3B, or 3C, in which the two LED elements 2a and 2b have one end connected to a common terminal. In FIG. 3A, the LED elements 2a and 2b have their cathode connected to a single common terminal 20, and have their anode connected to two separate terminals 21 and 22. In FIG. 3B, the cathode of one LED element 2a and the anode of the other LED element 2b are connected to a single common terminal 20, and the anode of the LED element 2a and the cathode of the LED element 2b are connected to two separate terminals 21 and 22. In FIG. 3C, in an exactly reverse manner as compared with FIG. 3A, the LED elements 2a and 2b have their anode connected to a single common terminal 20, and have their cathode connected to two separate terminals 21 and 22.

In any of the arrangements described above, it is possible to emit light in three colors in total by turning on the two LED elements simultaneously or individually. Specifically, in the arrangement of FIG. 3A, when only the LED element 2a is made to emit light, electric current is passed from the terminal 21 to the common terminal 20; when only the LED element 2b is made to emit light, electric current is passed from the terminal 22 to the common terminal 20; when the two are made to emit light simultaneously, electric current is passed from the terminals 21 and 22 to the common terminal 20 simultaneously. In the arrangement of FIG. 3C, electric current is passed exactly in the reverse directions, that is, from the common terminal 20 to the terminal 21, or to the terminal 22, or to both.

In the arrangement of FIG. 3B, when only the LED element 2a is made to emit light, electric current is passed from the terminal 21 to the common terminal 20; when only the LED element 2b is made to emit light, electric current is passed from the common terminal 20 to the terminal 22; when the two are made to emit light simultaneously, electric current is passed from the terminal 21 to the terminal 22.

Figure 4:
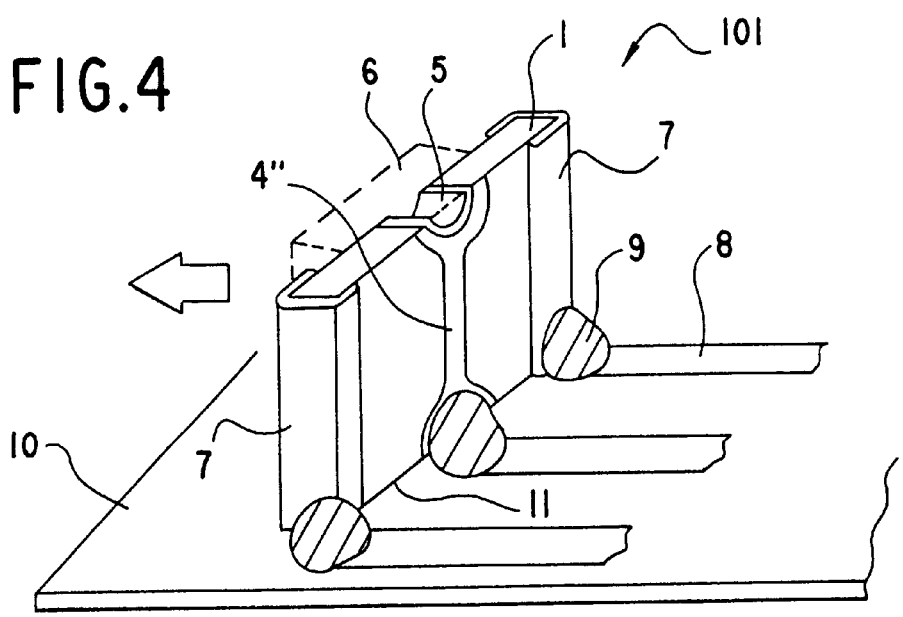
FIG. 4 is a diagram showing how the LED chip component of the first embodiment is used to achieve side-surface light emission.

When the LED chip component 101 of this embodiment is used to achieve side-surface light emission, which is the primary object of the present invention, it is mounted on a printed circuit board as shown in FIG. 4. Specifically, the LED chip component 101 is placed on and fixed to the printed circuit board 10 of a light-emitting device or the like, with a side surface of the insulating substrate 1 facing the top surface of the printed circuit board 10, by soldering the pattern 4" and the right-hand and left-hand terminal patterns 7 to the printed circuit 8 formed on the printed circuit board 10, with solder 9 applied at one edge of the insulating substrate 1. As a result, at the same time that the LED chip component 101 is mounted on the printed circuit board 10, the two LED elements 2a and 2b (not shown) are securely connected to the printed circuit 8, making it possible to achieve side-surface light emission as indicated by the arrow.

Figure 5:
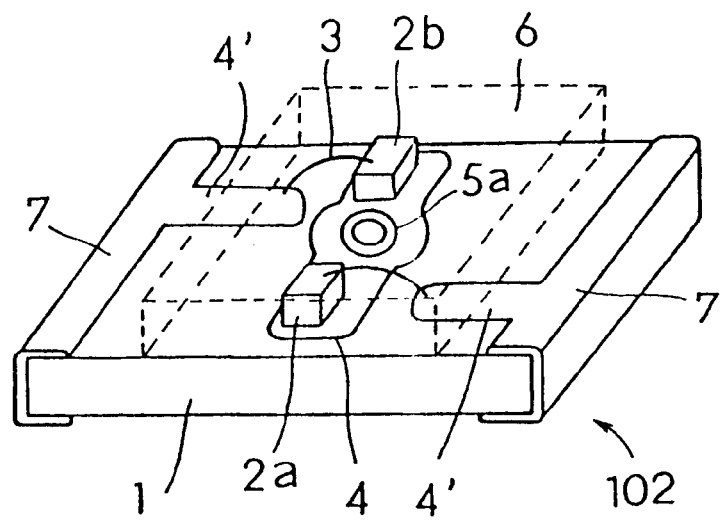
FIG. 5 is a perspective view of the LED chip component of a second embodiment of the invention, as seen obliquely from above.

FIG. 5 is a perspective view of the LED chip component 102 of a second embodiment of the invention as seen obliquely from above. As shown in FIG. 5, in this embodiment, near the center of the insulating substrate 1, a through hole 5a is provided that extends from the top surface to the bottom surface of the insulating substrate 1. The through hole 5a has its entire inner surface coated with metal. The two LED elements 2a and 2b are fixed respectively in front of and behind the through hole 5a by die-bonding. The LED elements 2a and 2b have one end connected directly to the land of the pattern 4 that extends forward and backward from the through hole 5a so as to form a single common electrode. In other respects, the LED chip component 102 of this embodiment is constructed in the same manner as that of the first embodiment.

Figure 6:
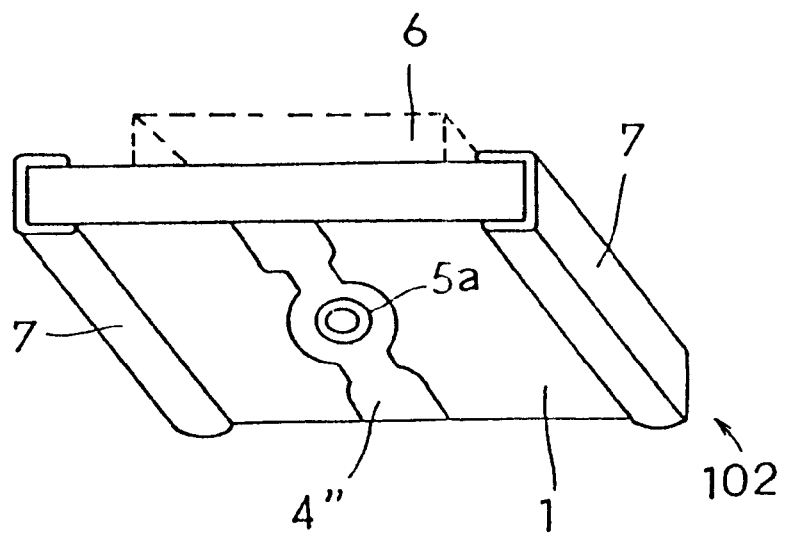
FIG. 6 is a perspective view of the LED chip component of the second embodiment, as seen obliquely from below.

FIG. 6 is a perspective view of the LED chip component 102 as seen obliquely from below. On the bottom surface of the insulating substrate 1, the pattern 4" extends from the through hole 5a up to the central portions of the front and rear edges of the insulating substrate 1 so as to form a common terminal. Just as in the first embodiment, this pattern 4" serves also as a land for soldering when the LED chip component 102 is mounted vertically to achieve side-surface light emission. This LED chip component 102 contains the same circuit as that of the first embodiment.

Figure 7:
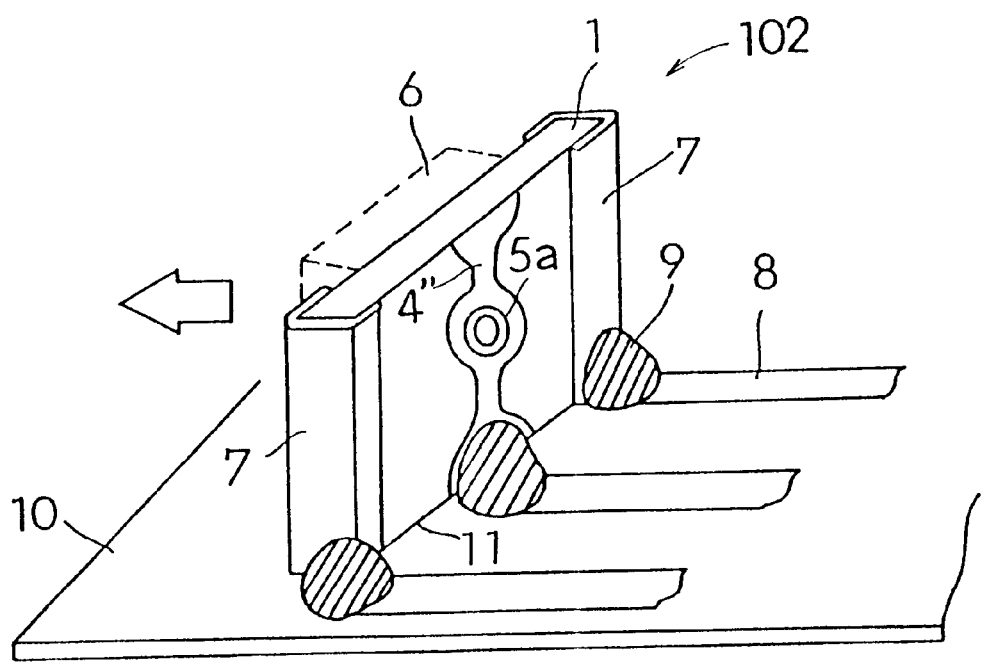
FIG. 7 is a diagram showing how the LED chip component of the second embodiment is used to achieve side-surface light emission.

When the LED chip component 102 of this embodiment is used to achieve side-surface light emission, it is mounted on a printed circuit board as shown in FIG. 7. Specifically, as in the first embodiment, the LED chip component 102 is placed on and fixed to the printed circuit board 10, with a side surface of the insulating substrate 1 facing the top surface of the printed circuit board 10, by soldering the pattern 4" and the right-hand and left-hand terminal patterns 7 to the printed circuit 8 formed on the printed circuit board 10, with solder 9 applied at one edge of the insulating substrate 1. As a result, at the same time that the LED chip component 102 is mounted on the printed circuit board 10, the two LED elements 2a and 2b (not shown) are securely connected to the printed circuit 8, making it possible to achieve side-surface light emission as indicated by the arrow.

In the LED chip component 101 of the first embodiment, when the resin molding 6 is formed, there is a risk that resin flow into the through holes that will eventually been formed into the cuts 5 and covers the metal surface coating of the cuts 5. This makes soldering difficult or impossible. However, in the LED chip component 102 of the second embodiment, the through hole 5a is placed away from the patterns that are soldered, and therefore there is no risk of those patterns being covered with resin. This ensures secure soldering. In addition, the resin molding 6 in the second embodiment is so formed as to flow into (i.e. reach the inside of) the through hole 5a formed in the insulating substrate.

In this case, however, if the LED chip component 102 is mounted on a printed circuit board horizontally, that is, with the bottom surface of the insulating substrate 1 facing the printed circuit board as described earlier in connection with the conventional example, it is difficult to apply soldering. Accordingly, to make the LED chip component 102 suitable also for top-surface light emission, it is advisable to extend the pattern 4" on the bottom surface so as to cover also at least part of side surfaces of the insulating substrate 1.

Figure 8:
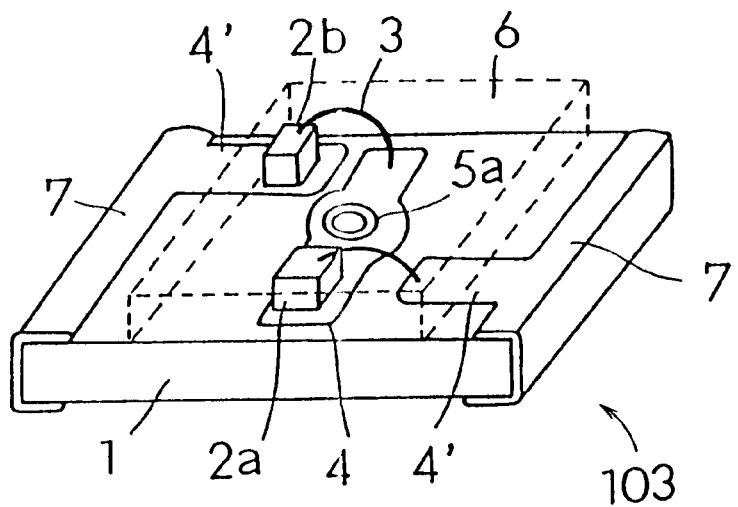
FIG. 8 is a perspective view of the LED chip component of a third embodiment of the invention, as seen obliquely from above.

FIG. 8 is a perspective view of the LED chip component 103 of a third embodiment of the invention as seen obliquely from above. As shown in FIG. 8, in this embodiment, the two LED elements 2a and 2b have one end connected directly to the patterns 4 and 4', respectively, so as to form separate electrodes, and have the other end connected through wires 3 to the patterns 4' and 4, respectively, by wire-bonding so as to form separate electrodes. In other respects, the LED chip component 103 of this embodiment is constructed in the same manner as that of the second embodiment.

Figure 9:
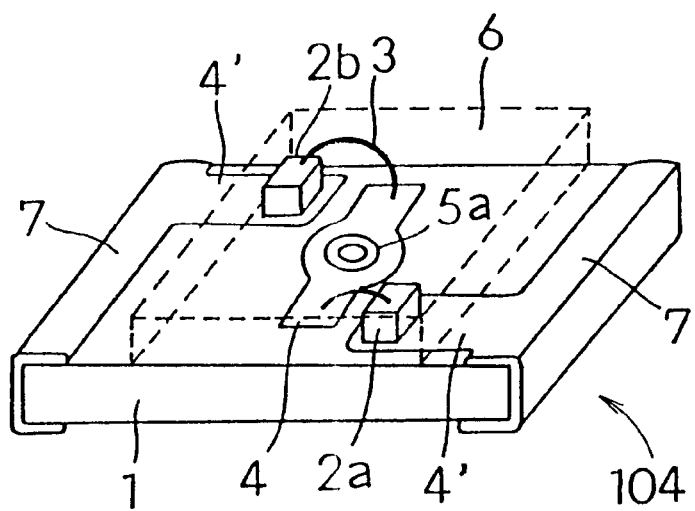
FIG. 9 is a perspective view of the LED chip component of a fourth embodiment of the invention, as seen obliquely from above.
Figure 10A:
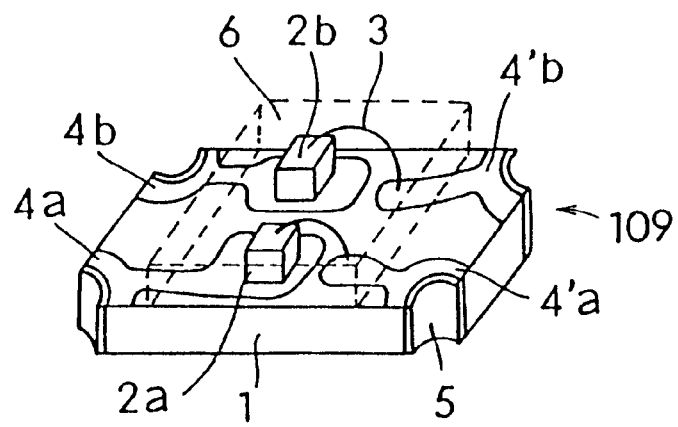
FIG. 10A is a perspective view of a conventional two-color LED chip component.
Figure 10B:
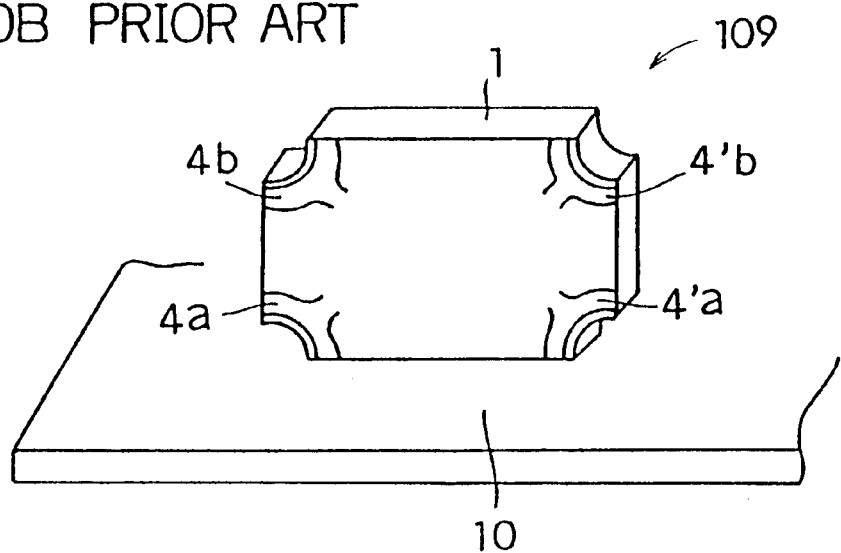
FIG. 10B is a diagram explaining the difficulty to be overcome when the conventional two-color LED chip component is used to achieve side-surface light emission.
Figure 11:
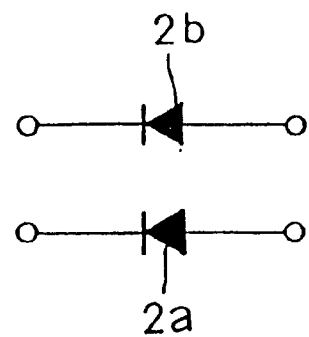
FIG. 11 is a diagram showing the circuit of the conventional two-color LED chip component.

FIG. 9 is a perspective view of the LED chip component 104 of a fourth embodiment of the invention as seen obliquely from above. As shown in FIG. 9, in this embodiment, the two LED elements 2a and 2b have one end connected directly to the patterns 4' individually so as to form two separate electrodes, and have the other end connected through wires 3 to the pattern 4 by wire-bonding so as to form a single common electrode. In other respects, the LED chip component 104 of this embodiment is constructed in the same manner as that of the second embodiment. In this way, the LED elements and other elements can be arranged in various manners.

As described above, according to the present invention, it is possible to obtain a two-color LED chip component whose terminals are so arranged that the LED chip component can be mounted vertically to achieve side-surface light emission. This makes it possible to make light-emitting devices and related appliances slimmer.

Obviously, many modifications and variations of the present invention are possible in light of the above teachings. It is therefore to be understood that within the scope of the appended claims, the invention may be practiced other than as specifically described.

What is claimed is:

1. A light-emitting diode chip component comprising:
   an insulating substrate having a shape of a substantially rectangular plate;
   a light-emitting diode chip mounted on a top surface of the insulating substrate;
   a resin molding formed on the top surface of the insulating substrate to seal in the light-emitting diode chip;
   a pair of electrode terminals formed on the top surface of the insulating substrate so as to extend along a pair of opposing side edges of the insulating substrate; and
   a pair of concave cuts, extending from the top surface to a bottom surface, is formed at another pair of opposing side edges of said insulating substrate, and said resin molding is so formed as to flow into said concave cuts.

* * * * *